(12) United States Patent
Hwang et al.

(10) Patent No.: US 9,841,857 B2
(45) Date of Patent: Dec. 12, 2017

(54) CONDUCTIVE PATTERN LAMINATE AND ELECTRONIC DEVICE COMPRISING SAME

(71) Applicant: LG CHEM, LTD., Seoul (KR)

(72) Inventors: Ji Young Hwang, Daejeon (KR); Dong Hyun Oh, Daejeon (KR); Hang Suk Choi, Daejeon (KR); Seung Heon Lee, Daejeon (KR); Sungjoon Min, Daejeon (KR)

(73) Assignee: LG CHEM, LTD., Seoul (KR)

( * ) Notice: Subject to any disclaimer, the term of this patent is extended or adjusted under 35 U.S.C. 154(b) by 140 days.

(21) Appl. No.: 14/778,462

(22) PCT Filed: Mar. 24, 2014

(86) PCT No.: PCT/KR2014/002468
§ 371 (c)(1),
(2) Date: Sep. 18, 2015

(87) PCT Pub. No.: WO2014/148878
PCT Pub. Date: Sep. 25, 2014

(65) Prior Publication Data
US 2016/0282982 A1    Sep. 29, 2016

(30) Foreign Application Priority Data

Mar. 22, 2013   (KR) .................. 10-2013-0031178

(51) Int. Cl.
*G06F 3/041*   (2006.01)
*G06F 1/16*    (2006.01)
(Continued)

(52) U.S. Cl.
CPC ............ *G06F 3/044* (2013.01); *G06F 1/1643* (2013.01); *H05K 1/0296* (2013.01);
(Continued)

(58) Field of Classification Search
CPC .... G03F 7/0002; G06F 1/1643; G06F 1/1652; G06F 3/147; G06F 3/041; G06F 3/0412; H05K 1/0296; H05K 1/0313; H05K 3/10
See application file for complete search history.

(56) References Cited

U.S. PATENT DOCUMENTS 7,001,658 B2   2/2006  Bourdelais et al.
2001/0013294 A1*  8/2001  Bruno ................... B82Y 10/00
                                                        101/327
(Continued)

FOREIGN PATENT DOCUMENTS

JP   2006-524900 A   11/2006
JP   2011-060617 A    3/2011
(Continued)

*Primary Examiner* — Michael J Eurice
(74) *Attorney, Agent, or Firm* — Dentons US LLP

(57)    ABSTRACT

The present application provides a conductive pattern laminate including: a substrate having concave portions or protrusion portions on an upper surface thereof; and a conductive film provided on an upper surface of concave portions or protrusion portions of the substrate and on a portion in which no concave portions or protrusion portions are present on the upper surface of the substrate, in which the conductive film provided on the upper surface of concave portions or protrusion portions of the substrate and the conductive film provided on the portion in which no concave portions or protrusion portions are present on the upper surface of the substrate are electrically disconnected from each other, a method for manufacturing the same, and an electronic apparatus including the laminate.

21 Claims, 10 Drawing Sheets

(51) Int. Cl.
  *G02F 1/1333* (2006.01)
  *G06F 3/044* (2006.01)
  *H05K 1/02* (2006.01)
  *H05K 1/03* (2006.01)
  *H05K 3/10* (2006.01)
  *G06F 3/147* (2006.01)
  *H05K 3/00* (2006.01)
  *H05K 3/16* (2006.01)

(52) U.S. Cl.
  CPC ............ *H05K 1/0313* (2013.01); *H05K 3/10* (2013.01); *G06F 1/1652* (2013.01); *G06F 3/147* (2013.01); *G06F 2203/04103* (2013.01); *H05K 3/0014* (2013.01); *H05K 3/16* (2013.01); *H05K 2201/0326* (2013.01); *H05K 2203/0108* (2013.01)

(56) References Cited

U.S. PATENT DOCUMENTS

| | | | | |
|---|---|---|---|---|
| 2003/0196987 | A1* | 10/2003 | Kung | B82Y 10/00 216/2 |
| 2004/0213954 | A1* | 10/2004 | Bourdelais | H05K 3/107 428/119 |
| 2005/0163932 | A1* | 7/2005 | Zschieschang | H01L 51/0022 427/258 |
| 2005/0183589 | A1* | 8/2005 | Salmon | H05K 3/0014 101/3.1 |
| 2006/0279842 | A1* | 12/2006 | Kim | G02B 5/3058 359/485.05 |
| 2010/0182253 | A1* | 7/2010 | Park | G06F 3/044 345/173 |
| 2010/0209594 | A1* | 8/2010 | Curtis | B41M 5/0023 427/74 |
| 2010/0265206 | A1* | 10/2010 | Chen | G06F 3/0412 345/174 |
| 2010/0265207 | A1* | 10/2010 | Chen | G06F 3/0412 345/174 |
| 2011/0187666 | A1* | 8/2011 | Min | G06F 3/041 345/173 |
| 2011/0318553 | A1* | 12/2011 | Lotz | C23C 14/34 428/212 |
| 2012/0175235 | A1* | 7/2012 | Jiang | G06F 3/044 200/600 |
| 2012/0234663 | A1* | 9/2012 | Hwang | G06F 3/044 200/600 |
| 2012/0236388 | A1* | 9/2012 | De Wind | B60R 1/04 359/267 |
| 2012/0268402 | A1* | 10/2012 | Wang | G06F 3/041 345/173 |
| 2014/0016278 | A1 | 1/2014 | Hwang et al. | |
| 2014/0071637 | A1* | 3/2014 | Hsu | H05K 1/0213 361/748 |
| 2014/0138133 | A1* | 5/2014 | Byun | H05K 1/097 174/257 |
| 2014/0198267 | A1* | 7/2014 | Jeong | G06F 3/041 349/12 |
| 2015/0015813 | A1* | 1/2015 | Yoshinari | C07D 251/24 349/12 |
| 2015/0029412 | A1* | 1/2015 | Kishioka | G06F 3/044 349/12 |

FOREIGN PATENT DOCUMENTS

| | | |
|---|---|---|
| JP | 2011-85920 A | 4/2011 |
| JP | 2011-114194 A | 6/2011 |
| JP | 2011114194 A | 6/2011 |
| JP | 2011-191766 A | 9/2011 |
| JP | 2012-59091 A | 3/2012 |
| JP | 2012-199042 A | 10/2012 |
| JP | 2013-25448 A | 2/2013 |
| KR | 10-2009-0110770 A | 10/2009 |
| KR | 10-2012-0110065 A | 10/2012 |
| TW | 201305871 A1 | 2/2013 |

* cited by examiner

[Figure 1]
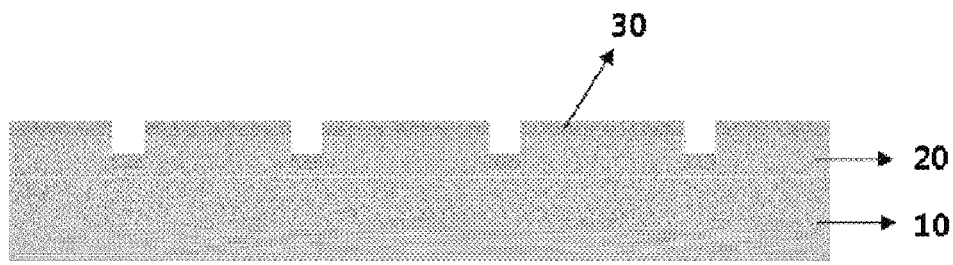
[Figure 2]
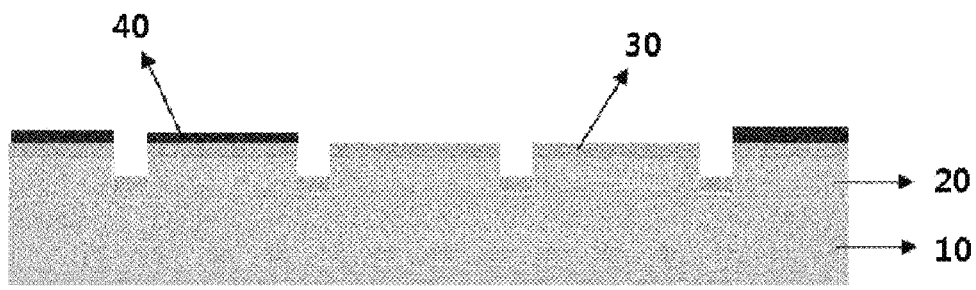

[Figure 4]
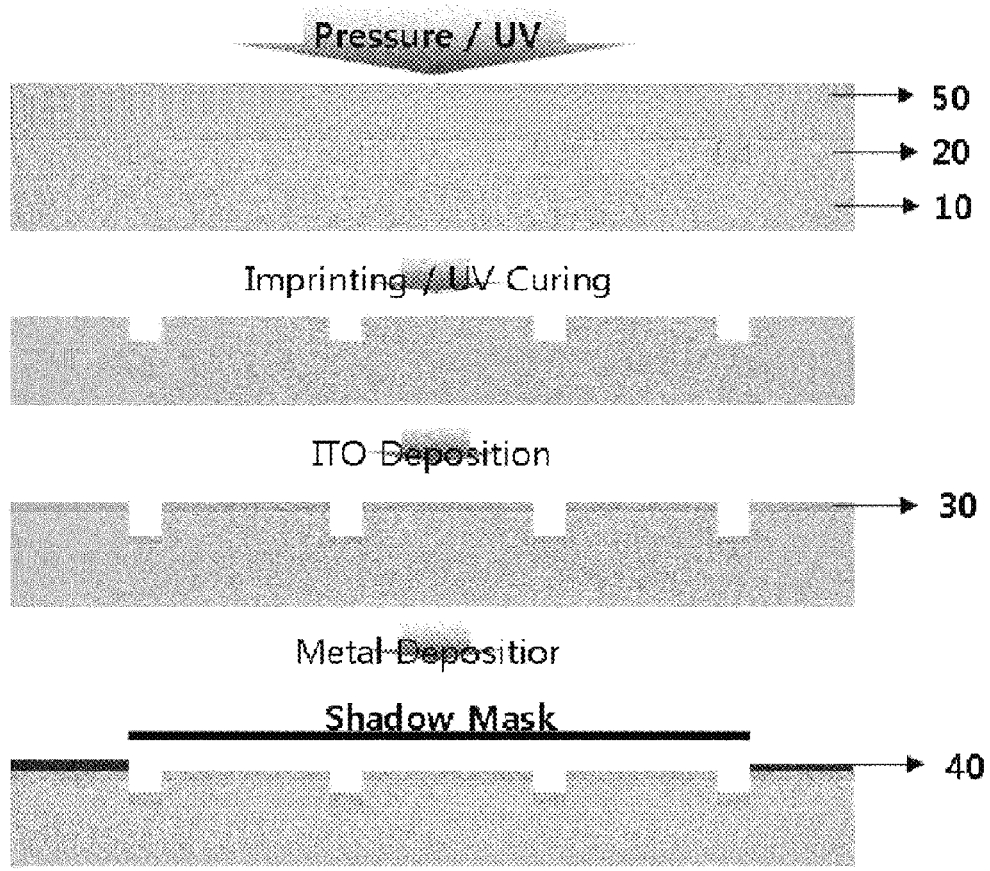

[Figure 5]
<Line Width 20μm>
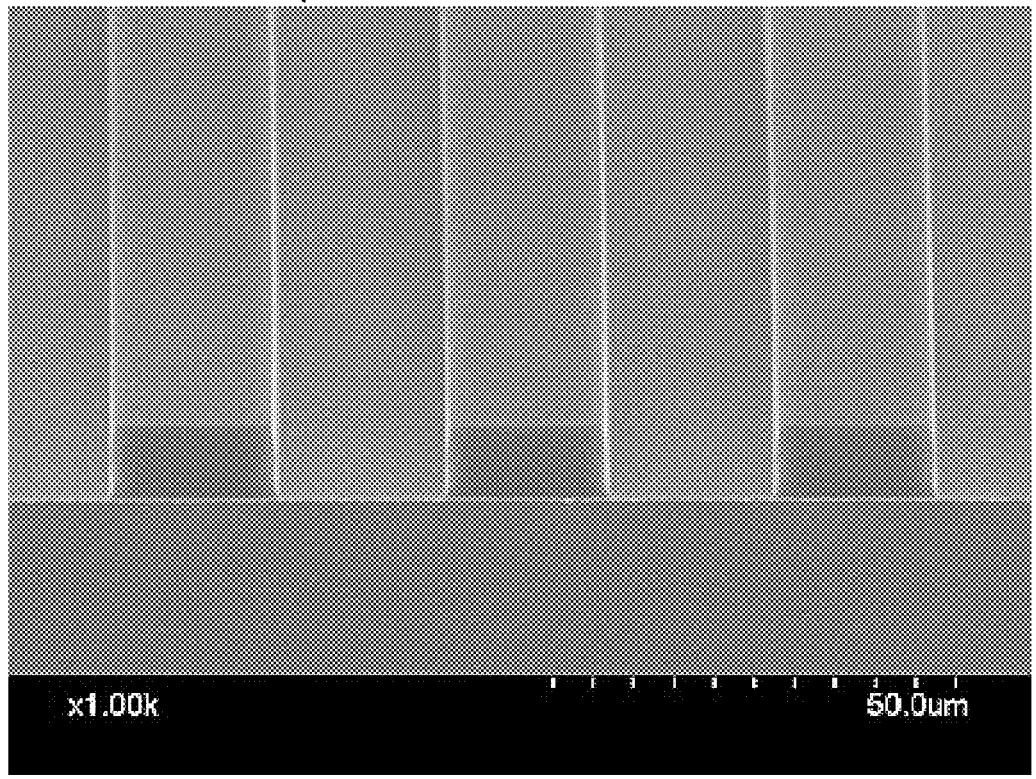

[Figure 6]
< Line Width 10μm >
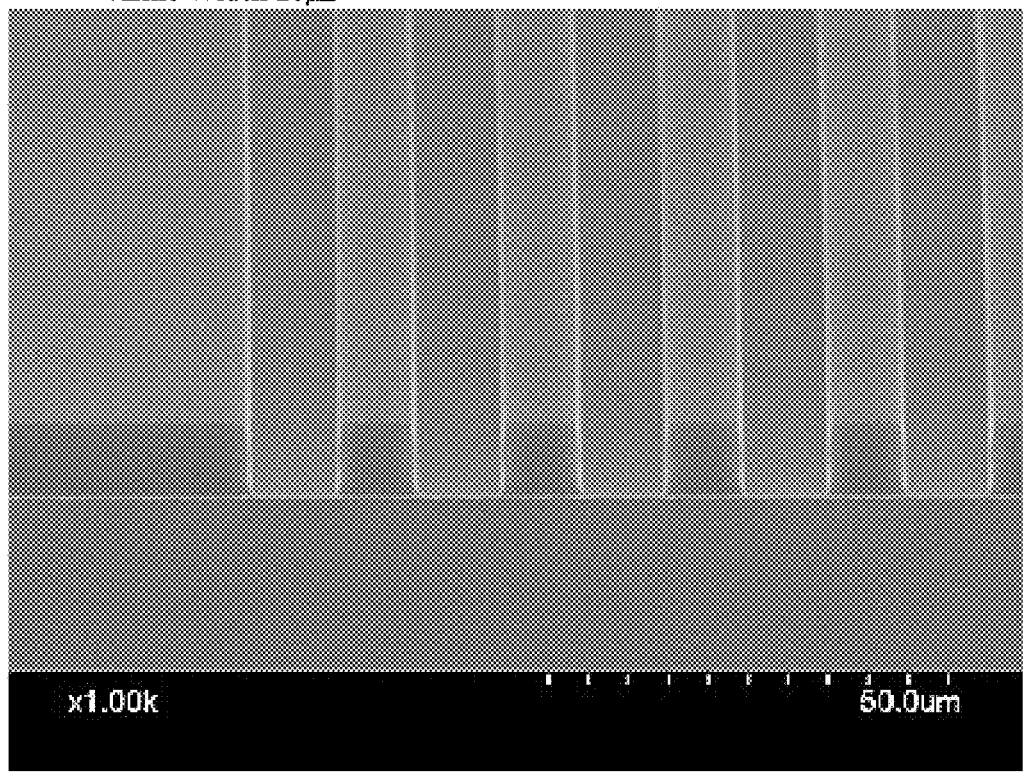

[Figure 7]
< Line Width 3μm >
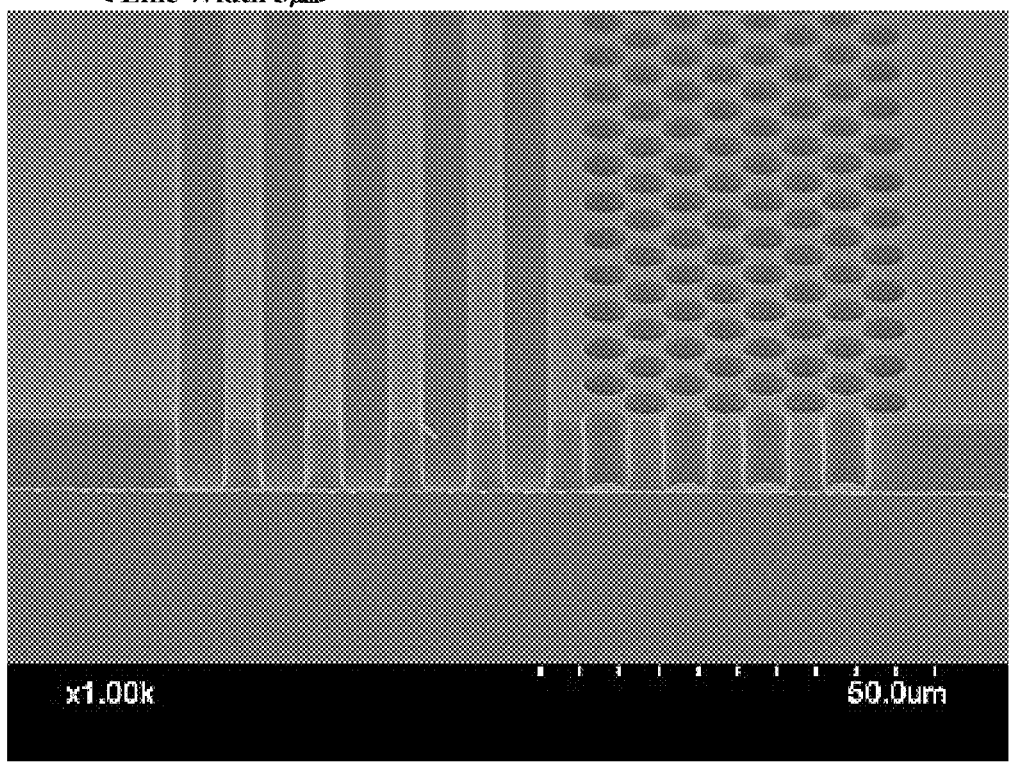

[Figure 8]
< Line Width 20μm >
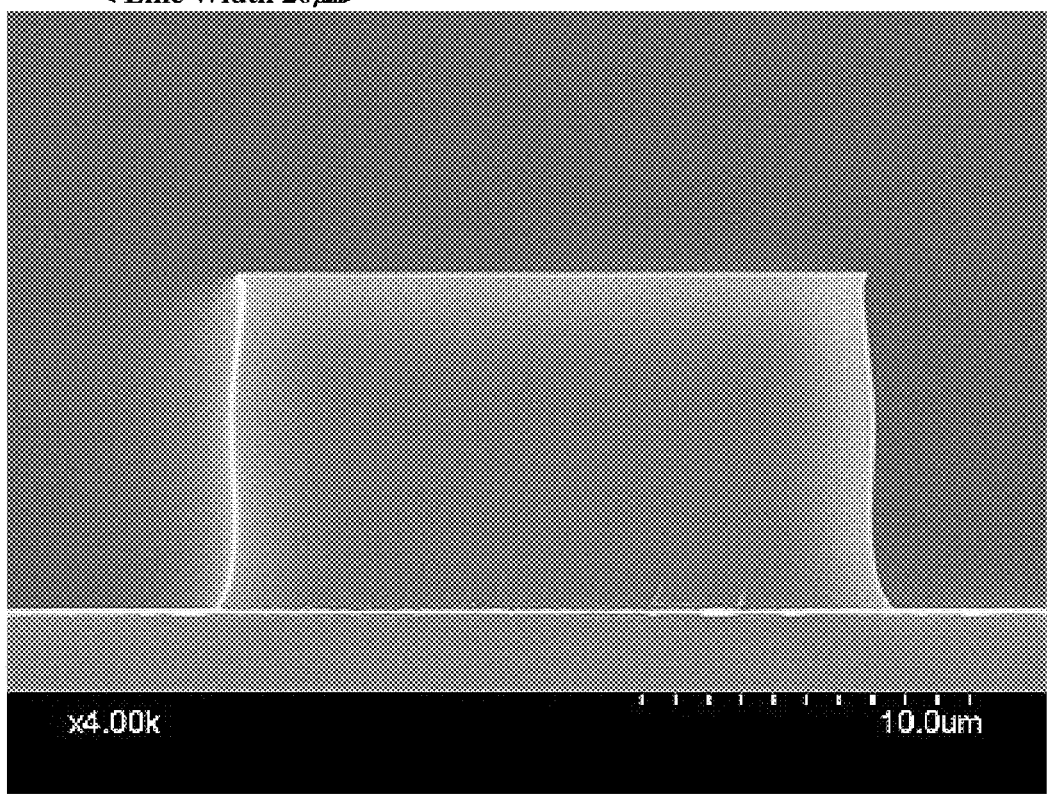

[Figure 9]
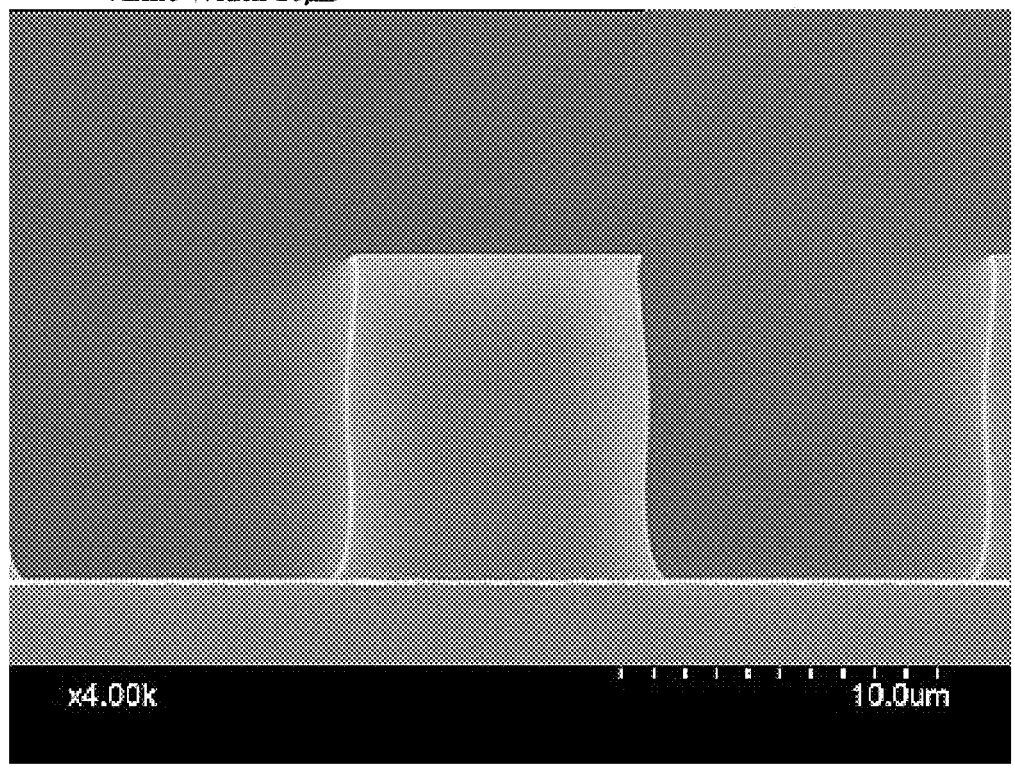

[Figure 10]
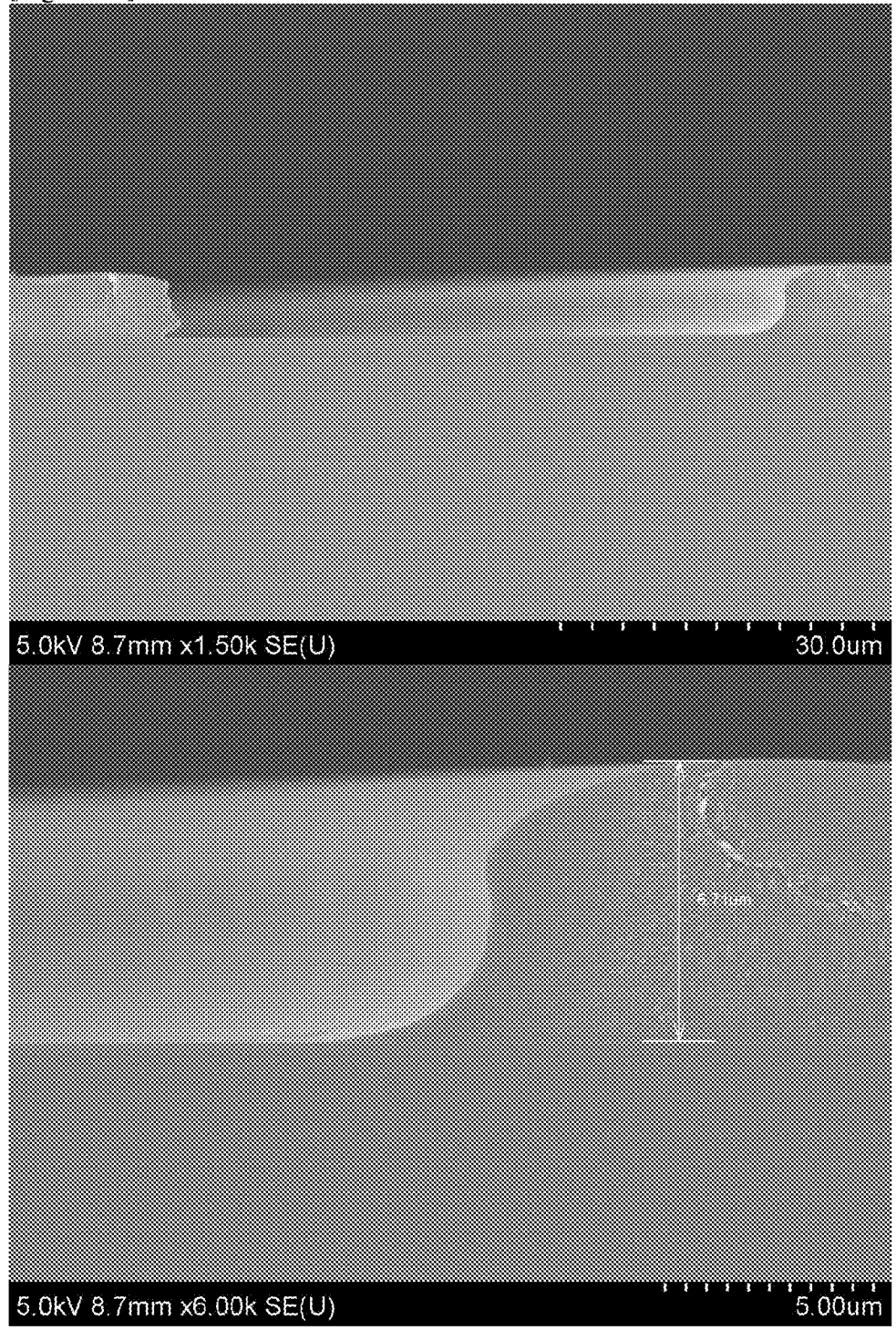

[Figure 11]
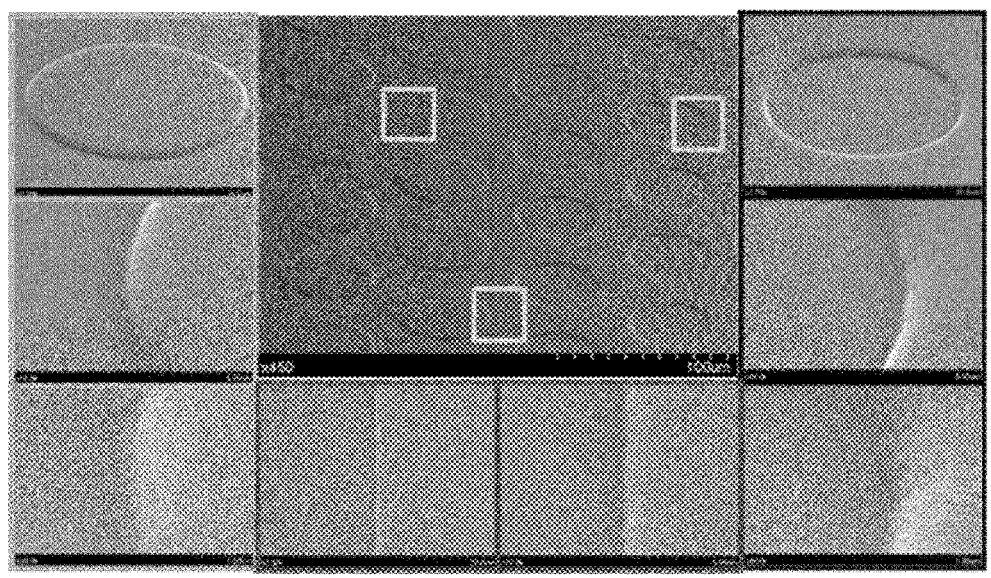

CONDUCTIVE PATTERN LAMINATE AND ELECTRONIC DEVICE COMPRISING SAME

TECHNICAL FIELD

This application is a National Stage Entry of International Application No. PCT/KR2014/002468, filed Mar. 24, 2014, and claims the benefit of Korean Application No. 10-2013-0031178, filed on Mar. 22, 2013, all of which are hereby incorporated by reference in their entirety for all purposes as if fully set forth herein. The present application relates to a conductive pattern laminate and an electronic apparatus including the same.

BACKGROUND ART

In general, a display device collectively refers to monitors for a TV or a computer, and includes a display element forming an image and a case supporting the display element.

Meanwhile, with regard to the display device, as the distribution of IPTVs becomes accelerated, a need for a touch function that uses hands as a direct input apparatus without a separate input apparatus such as remote controllers is growing. Further, a multi-touch function that is capable of recognizing a specific point and writing is also required.

A touch screen performing the aforementioned function may be classified into the following types according to the type that detects a signal.

That is, examples thereof include a resistive type sensing a position, which is pressed down by pressure, through a change in current or voltage value while a direct current voltage is applied thereto, a capacitive type using a capacitance coupling while an alternating current voltage is applied thereto, an electromagnetic type sensing a selected position as a change in voltage while a magnetic field is applied thereto, and the like.

CITATION LIST

Patent Document (Patent Document 1) Official Gazette of Korean Patent Application Laid-Open No. 10-2010-0007605

DETAILED DESCRIPTION OF THE INVENTION

Technical Problem

The present application provides a conductive pattern laminate and an electronic apparatus including the same.

Technical Solution

An exemplary embodiment of the present application provides a conductive pattern laminate including:

a substrate having concave portions or protrusion portions on an upper surface thereof; and a conductive film provided on an upper surface of concave portions or protrusion portions of the substrate and on a portion in which no concave portions or protrusion portions are present on the upper surface of the substrate, in which the conductive film provided on the upper surface of concave portions or protrusion portions of the substrate and the conductive film provided on the portion in which no concave portions or protrusion portions are present on the upper surface of the substrate are electrically disconnected to each other.

Another exemplary embodiment of the present application provides a conductive pattern laminate, in which when an edge of the substrate is a decoration part and a central portion surrounded by the decoration part is an effective screen part, the conductive film provided on the portion in which no concave portions or protrusion portions are present on the upper surface of the substrate includes two or more patterns electrically disconnected to each other by the concave portions or the protrusion portions, and at least a part of the two or more patterns comprise an effective screen region provided in the effective screen part and a router region provided in the decoration part and electrically connecting the effective screen region to a voltage application part.

Another exemplary embodiment of the present application provides a conductive pattern laminate in which an additional conductive layer is provided on the router region of the conductive film provided in the decoration part.

Another exemplary embodiment of the present application provides a conductive pattern laminate in which a portion in which the router regions are provided in the decoration part on the upper surface of the substrate is excluded, the conductive film provided on the portion in which no concave portions or protrusion portions are present is electrically disconnected from the voltage application part by the concave portions or the protrusion portions.

Another exemplary embodiment of the present application provides a conductive pattern laminate in which an additional conductive layer is provided between the router region of the conductive film and a decoration layer or on the upper surface of the decoration layer.

Another exemplary embodiment of the present application provides a conductive pattern laminate in which an additional conductive layer is provided between the conductive film provided in the decoration part and the decoration layer or on the upper surface of the decoration layer.

Another exemplary embodiment of the present application provides a conductive pattern laminate in which a portion provided on the upper surface of the router region of the conductive film in the decoration layer and on the upper surface of the conductive film electrically disconnected from the voltage application part by concave portions or protrusion portions includes a fine pattern having a fine short-circuit width. The region including the fine pattern may additionally include a dummy pattern.

Another exemplary embodiment of the present application provides an electronic apparatus including one or more of the aforementioned conductive pattern laminate.

Another exemplary embodiment of the present application provides a method for manufacturing a conductive pattern laminate, the method including:

preparing a substrate including concave portions or protrusion portions; and forming a conductive film having a thickness less than a depth of the concave portions or a height of the protrusion portions over an entire region of an upper surface of the substrate.

The method for manufacturing a conductive pattern laminate may further include: protecting a portion in which an edge of the substrate on which the conductive film is formed is excluded with a protective film; and forming an additional conductive layer on the edge.

The method for manufacturing a conductive pattern laminate may further include forming a decoration layer on the additional conductive layer.

The method for manufacturing a conductive pattern laminate may further include removing the protective film.

Advantageous Effects

According to the exemplary embodiments of the present application, an electrically disconnected conductive pattern may be formed using a difference in height on the surface of the substrate according to the concave portions or protrusion portions on the substrate. Specifically, according to the exemplary embodiments of the present application, the process is very easy and an economically significant effect is obtained because by only forming a conductive film over the entire region on the upper surface of the substrate, a conductive pattern may be formed without any need for removing a part of the conductive film.

Further, since a conductive film is formed on the entire area of the upper surface of the substrate, no alignment is needed when a router part is formed. In addition, in the process of removing an etchant or a resist when a pattern is formed, the surface of the pattern may be roughened or a part of the pattern may be lost, and in this case, haze may be increased, but according to the exemplary embodiments of the present application, excellent optical properties may be provided because the process of removing an etchant or a resist when a pattern is formed is not included. Furthermore, since there is only a fine difference in height on the surface, and materials are applied on the entire area not on the pattern, there is no concern in that the pattern is visually conspicuous.

Further, according to the present application, no separate index matching layer required for an ITO sensor in the related art is included, and simultaneously, no separate alignment is needed when a wiring part such as a router part is formed, and accordingly, a screen part and the wiring part may be simultaneously formed.

BRIEF DESCRIPTION OF DRAWINGS

FIGS. 1 and 2 illustrate a cross-sectional schematic view of a conductive pattern laminate according to an exemplary embodiment of the present application.

FIG. 3A shoes a cross-sectional schematic view of the laminate. The figure illustrates an electric circuit interval and an electric disconnection interval. FIG. 3B illustrates an exemplary application in a cellular phone, showing a decoration part (A region) surrounding an effective screen part (B region). FIG. 3C illustrates a magnified view of the A region, showing alternating connection intervals and disconnection intervals. FIG. 3D illustrates a magnified view of the B region, showing the conductive pattern. FIGS. 3E and 3F illustrate and effective screen part surrounded by a decoration part.

FIG. 4 illustrates a schematic view of a process of manufacturing the conductive pattern laminate according to an exemplary embodiment of the present application.

FIGS. 5 to 9 are views illustrating a form of a pattern including concave portions or protrusion portions as an exemplary embodiment of the present application. FIG. 5 shows a pattern where the line width is 20 µm. FIG. 6 shows a pattern where the line width is 10 µm. FIG. 7 shows a pattern where the line width is 20 µm. FIG. 9 shows a more magnified view of a pattern where the line width is 10 µm.

FIG. 10 is a view illustrating a form of a pattern including concave portions or protrusion portions as an exemplary embodiment of the present application.

FIG. 11 is a view illustrating a form of a pattern including concave portions or protrusion portions according to Comparative Example 1.

DESCRIPTION OF MAIN PARTS OF DRAWINGS

Figure 3A:
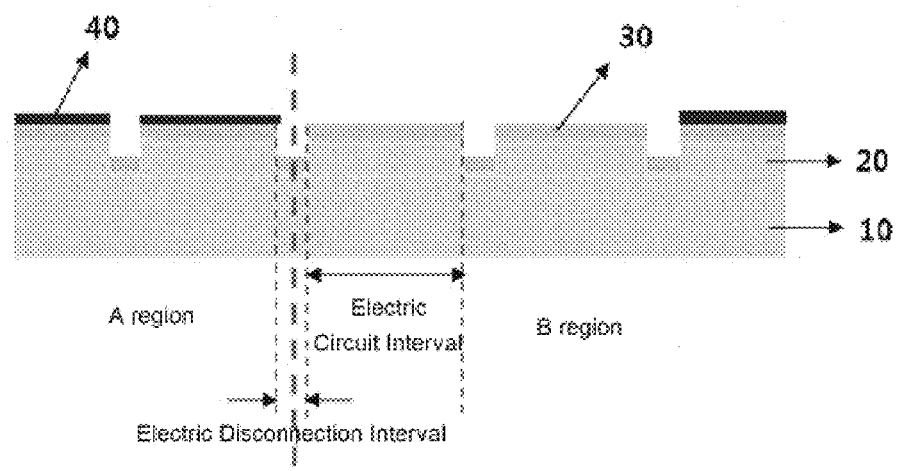
FIGS. 3A through 3F illustrate a pattern form of a conductive film of the conductive pattern laminate according to an exemplary embodiment of the present application.

10: Support substrate
20: Resin substrate
30: Conductive film
40: Metal layer
50: Soft mold

[Best Mode]

Hereinafter, the present application will be described in detail.

In the case of an indium tin oxide (ITO)-based capacitive touch panel in the related art, concealment of a pattern is reduced by separately performing a patterning process of an ITO screen part and a process of a wiring part, and simultaneously forming a pattern through by wet etching, of which compensation thereof is generally performed through an additional index matching layer. Complexity of the process and inclusion of the additional index matching layer are responsible for an increase in the raw material cost of the ITO film per se and a decrease in yield due to the process, and finally, a process of aligning a wiring part and a screen part is needed, so that there occur problems such as introduction of a unit sheet process for securing the dimensional stability or limitation of a roll film width, and restriction on the interval between cells (arrangement restriction).

Thus, in the present application, a pattern is formed through the photolithography process or imprinting process in the related art, and then an effort has been made to form an electric circuit by performing a dry process such as an ITO deposition process to use a step difference generated during the imprinting process. Accordingly, since it is possible to collectively implement an electric circuit without an additional wiring part patterning process and a sensor may be configured while the ITO is deposited on the entire surface, there is an advantage in that a separate layer such as the index matching layer in the related art is not needed. Further, the present application has an advantage in that the yield is high due to the significant decrease in difficulties of the process compared to the existing process.

The conductive pattern laminate according to an exemplary embodiment of the present application includes a substrate having concave portions or protrusion portions on an upper surface thereof; and a conductive film provided on an upper surface of the concave portions or protrusion portions of the substrate and on a portion in which no concave portions or protrusion portions are present on the upper surface of the substrate, in which the conductive film provided on the upper surface of the concave portions or protrusion portions of the substrate and the conductive film provided on the portion in which no concave portions or protrusion portions are present on the upper surface of the substrate are electrically disconnected from each other.

In other words, a system that a conductive film is formed on the entire surface of a substrate, and then some patterns are removed is used, or a system that printing in the form of a specific pattern is performed is used, in order to form a conductive pattern in the related art, whereas according to the exemplary embodiment of the present application, a conductive pattern may be formed only by forming a conductive film on the entire surface on the substrate without any need of removing an additional pattern or using a printing system in the form of a pattern.

Specifically, according to the exemplary embodiment of the present application, by varying the height of the surface of a substrate positioned on the lower part of the conductive film, the conductive film becomes electrically disconnected in the form of a specific pattern by the step difference on the surface of the substrate. In other words, an electrically disconnected conductive pattern may be obtained by the concave portions or protrusion portions by forming concave portions or protrusion portions on the substrate.

In the present application, in order to pattern the conductive film by the concave portions or protrusion portions, the depth of the concave portions or the height of the protrusion portions may be controlled so as to be larger than the thickness of the conductive film. In the exemplary embodiment, the concave portions may have all the same depth, but the concave portions may include two or more concave portions which are different in depth. Likewise, the protrusion portions may have all the same height, but the protrusion portions may include two or more protrusion portions which are different in height. In addition, in order to pattern the conductive film by the concave portions or the protrusion portions, the taper angle of the concave portions or the protrusion portions may be adjusted to an appropriate value.

In the present application, the width, thickness and the like of the conductive film may be appropriately selected by the person skilled in the art so as to be suitable for use. More specifically, the thickness of the conductive film may be 0.1 nm to 100 nm and 1 nm to 50 nm, but is not limited thereto.

Furthermore, the width or depth of the concave portions, the width or height of the protrusion portions and the like may also be appropriately selected by the person skilled in the art so as to be suitable for use. More specifically, the depth of the concave portions or the height of the protrusion portions may be 0.1 μm to 30 μm, but is not limited thereto. When the depth of the concave portions or the height of the protrusion portions is less than 0.1 μm, the connection of the conductive film or the metal layer, which is not desired in the concave portions or protrusion portions occurs in the subsequent process of forming a conductive film or a metal layer, so that an electrical short-circuit is likely to occur. Furthermore, when the depth of the concave portions or the height of the protrusion portions exceeds 30 μm, during the subsequent optical clear adhesive (OCA) lamination process, the thickness of the OCA is generally 50 μm to 100 μm, so that concave portions or protrusion portions are not sufficiently covered and as a result, it is likely that a pattern may be recognized with bubbles and the like entrapped.

In particular, the width, the height and the like of the concave portions or protrusion portions may be selected in consideration of the taper angle of the concave portions or protrusion portions. In the present application, the taper angle of the concave portions or protrusion portions may be 60 or more degrees and 80 or more degrees, but is not limited thereto. For example, when the taper angle is 60 or more degrees and close to 90 degrees or a reverse taper angle is formed, it may cause the disconnection of the conductive film in the concave portions or protrusion portions during the process of depositing a conductive material. Further, when a region in which the taper angle is 60 or more degrees or the reverse taper angle is formed is present only in some regions, that is, some regions of a pattern stepped portion based on the cross-section of a pattern including the concave portions or protrusion portions, the effects according to the present application may be achieved. In addition, the depth of concave portions or the height of protrusion portions is preferably larger than the thickness of the conductive film in a region in which the taper angle is 60 or more degrees or a reverse taper angle is formed, and may be, for example, 0.2 μm or more, but is not limited thereto.

The concave portions or the protrusion portions are provided in the form that the conductive film provided on a portion in which no concave portions or protrusion portions are present on the upper surface of the substrate is separated into two or more patterns which are electrically disconnected from each other.

FIG. 1 illustrates an example in which the conductive film is separated into two or more patterns which are electrically disconnected from each other by concave portions.

In the exemplary embodiment, the substrate may be a resin substrate. The resin substrate is not particularly limited, but may be manufactured by using a UV-curable resin or thermosetting resin. As an example, a resin substrate having concave portions or protrusion portions may be manufactured by using an imprinting method. More specifically, the resin substrate may be directly used after a master is manufactured, and may also be used while being replicated as a soft mold.

The thermosetting resin may include one or more selected from the group consisting of an alkoxysilane reactant that may cause a sol-gel reaction, a urethane reaction group compound, a urea reaction group compound, an esterification reactant and the like. The thermosetting resin may additionally include other additives such as a fluorine-based compound.

The alkoxysilane reactant refers to a reactive oligomer prepared by performing a hydrolysis or a condensation reaction by a sol-gel reaction of the alkoxysilane, fluorine-based alkoxysilane, silane-based organic substituent and the like under water and catalyst conditions. In this case, the weight average molecular weight of the reactive oligomer may be 1,000 to 200,000 when determined by GPC using polystyrene as a standard material. The alkoxysilane reactant thus prepared is coated, and then a condensation reaction is performed under the temperature conditions of normal temperature or more, thereby forming a network with a crosslinked structure.

As the alkoxysilane, tetraalkoxysilanes or trialkoxysilanes may be used, and it is possible to use one or two or more materials selected from the group consisting of tetramethoxysilane, tetraethoxysilane, tetraisopropoxysilane, methyltrimethoxysilane, methyltriethoxysilane, glycidoxypropyl trimethoxysilane, and glycidoxypropyl triethoxysilane, but the alkoxysilane is not limited only to the examples.

As the fluorine-based alkoxysilane, it is possible to use one or two or more materials selected from the group consisting of tridecafluorooctyltriethoxysilane, heptadecafluorodecyltrimethoxysilane, and heptadecafluorodecyltriisopropoxysilane, but the fluorine-based alkoxysilane is not limited only to the examples.

The silane-based organic substituent may be chemically bonded to alkoxysilane, and may be used without limitation as long as the organic substituent is a compound having compatibility and reactivity with the high refractive index material. As the silane-based organic substituent, it is possible to use one or two or more materials selected from the group consisting of vinyl trimethoxy silane, vinyl tri(beta-methoxyethoxy)silane, vinyl triethoxy silane, vinyl tri-n-propoxy silane, vinyl tri-n-pentoxy silane, vinylmethyl dimethoxy silane, diphenyl ethoxy vinylsilane, vinyl triisopropoxy silane, divinyl di(beta-methoxyethoxy)silane, divinyl dimethoxy silane, divinyl diethoxy silane, divinyl di-n-propoxy silane, divinyl di(isopropoxy) silane, divinyl di-n-pentoxy silane, 3-acryloxypropyl trimethoxy silane, 3-methacryloxypropyl trimethoxy silane, gamma-methacryloxypropyl methyl diethoxy silane, and gamma-methacryloxypropyl methyl diethoxysilane, but the substituent is not limited only to the examples.

The alkoxysilane reactant may be prepared through a sol-gel reaction. The sol-gel reaction may use a method that is typically used in the art to which the present invention belongs. The sol-gel reaction may be performed by reacting a composition including alkoxysilane, a fluorine-based alkoxysilane, a silane-based organic substituent, a catalyst, water, and an organic solvent at a reaction temperature of 20° C. to 150° C. for 1 to 100 hours.

The catalyst that is used in the sol-gel reaction is a component that is required in order to control a sol-gel reaction time. As the catalyst, acids such as nitric acid, hydrochloric acid, sulfuric acid, and acetic acid may be used, and it is possible to use hydrochloride, nitrate, sulfate, and acetate forms in conjunction with salts such as zirconium and indium.

The water that is used in the sol-gel reaction is a component that is required for hydrolysis and condensation reactions.

The organic solvent used in the sol-gel reaction is a component for appropriately controlling a molecular weight of the hydrolyzed and condensed product. The organic solvent is preferably alcohols, cellosolves, ketones or two or more mixed solvents selected therefrom.

Meanwhile, the urethane reaction group compound may be prepared by reacting alcohol and an isocyanate compound under the metal catalyst. A network structure having the urethane reaction group may be formed by applying a coating solution in which multifunctional alcohol and multifunctional isocyanate having two or more functional groups and a metal catalyst are mixed with each other on a substrate, and then allowing the coating solution to be left at a temperature of normal temperature or more.

Examples of the polyfunctional alcohol include 1H,1H,4H,4H-perfluoro-1,4-butanediol, 1H,1H,5H,5H-perfluoro-1,5-pentanediol, 1H,1H,6H,6H-perfluoro-1,6-hexanediol, 1H,1H,8H,8H-perfluoro-1,8-octanediol, 1H,1H,9H,9H-perfluoro-1,9-nonanediol, 1H,1H,10H,10H-perfluoro-1,10-decanediol, 1H,1H,12H,12H-perfluoro-1,12-dodecanediol, fluorinated triethylene glycol, fluorinatedtetraethylene glycol and the like, but the polyfunctional alcohol is not limited thereto.

Examples of the isocyanate component that is used during the preparation of the urethane reaction group compound include aliphatic isocyanate, alicyclic isocyanate, aromatic isocyanate, and heterocyclic isocyanate. Specifically, diisocyanates such as hexamethylene diisocyanate, 1,3,3-trimethyl hexamethylene diisocyanate, isophorone diisocyanate, toluene-2,6-diisocyanate, and 4,4'-dicyclohexane diisocyanate or trifunctional or more isocyanates, for example, DN950 and DN980 that are a trademark and manufactured by DIC Co., Ltd. may be used.

A catalyst may be used during the preparation of the urethane reaction group compound, and a Lewis acid or a Lewis base may be used as the catalyst. Specific examples of the catalyst include tin octylate, dibutyltin diacetate, dibutyltin dilaulate, dibutyltin mercaptide, dibutyltin dimaleate, dimethyltin hydroxide, triethylamine and the like, but the catalyst is not limited thereto.

The urea reaction group compound may be prepared by a reaction of amines and isocyanates. As isocyanates, the same components as the components that may be used during the preparation of the urethane reaction group compound may be used, and as amines, bifunctional or more amines of perfluoros may be used. A catalyst may be used if necessary, and a Lewis acid or a Lewis base may be used as the catalyst. Specific examples of the catalyst include tin octylate, dibutyltin diacetate, dibutyltin dilaulate, dibutyltin mercaptide, dibutyltin dimaleate, dimethyltin hydroxide, triethylamine and the like, but the catalyst is not limited thereto.

The esterification reactant is obtained through dehydration and condensation reactions of acid and alcohol, and a film having a crosslinked structure may also be formed by mixing the esterification reactant with the coating solution. As the acid, a bifunctional or more acid including fluorine may be used, and examples of the bifunctional or more acid including fluorine include perfluorosuccinic acid, perfluoroglutaric acid, perfluoroadipic acid, perfluorosuberic acid, perfluoroazelaic acid, perfluorosebacic acid, perfluorolauric acid and the like. As the alcohol, polyfunctional alcohol may be used, and examples of the polyfunctional alcohol include 1,4-butanediol, 1,2-butanediol, 1,5-pentanediol, 2,4-pentanediol, 1,4-cyclohexanediol, 1,6-hexanediol, 2,5-hexanediol, 2,4-heptanediol, pentaerithritol, trimethyrolpropane and the like. An acid catalyst such as a sulfuric acid or alkoxy titan such as tetrabutoxy titan and the like may be used in the esterification reaction. However, the the present invention is not always limited thereto.

As the UV-curable resin, a material for photoresist known in the art may be used, and a novolac resin and the like may be used.

Further, as the UV-curable resin, an acrylate-based resin, a urethane acrylate-based resin and the like may be used. More specifically, examples of the UV-curable resin include an acrylate monomer, a urethane acrylate oligomer, an epoxy acrylate oligomer, an ester acrylate oligomer and the like, and specific examples thereof include dipentaerythritolhexaacrylate, pendaerythritol tri/tetra acrylate, trimethylenepropanetriacrylate, ethyleneglycoldiacrylate and the like, but the resin is not limited only to the examples. As the acrylate-based resin, a fluorine-based acrylate may be used.

The UV-curable resin may be used with a photoinitiator and an organic solvent.

As the photoinitiator, a compound that may be decomposed by UV may be used, and examples thereof include 1-hydroxy cyclohexylphenyl ketone, benzyl dimethyl ketal, hydroxydimethylaceto phenone, benzoin, benzoin methyl ether, or benzoin ethyl ether, benzoin isopropyl ether, benzoin butyl ether and the like, but the photoinitiator is not limited only to the examples.

As the organic solvent, alcohols, acetates, ketones, or aromatic solvents and the like are preferred, and specifically, it is possible to use methanol, ethanol, isopropyl alcohol, butanol, 2-methoxy ethanol, 2-ethoxy ethanol, 2-butoxy ethanol, 2-isopropoxy ethanol, methyl acetate, ethyl acetate, butyl acetate, methyl ethyl ketone, methyl isobutyl ketone, cyclohexane, cyclohexanon, toluene, xylene, benzene or the like.

Further, the UV-curable resin may additionally include a surfactant, fine particles and the like according to the use thereof.

In the present application, an additional support substrate may be provided on the upper surface and/or lower surface of the substrate, if necessary. As the support substrate, a material known in the art may be used, and more specifically, a glass substrate, a plastic substrate and the like may be used.

According to an exemplary embodiment of the present application, the substrate may be a transparent substrate, and the conductive film may be a transparent conductive film.

The transparent conductive film may include a transparent conductive oxide. The transparent conductive oxide may be at least one oxide selected from indium (In), tin (Sn), zinc (Zn), gallium (Ga), cerium (Ce), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), aluminum (Al), and lanthanum (La).

According to an exemplary embodiment, a transparent conductive film provided on a portion in which no concave portions or protrusion portions are present on the upper surface of the transparent substrate includes two or more patterns which are electrically disconnected from each other by the concave portions or the protrusion portions, and at least a part of the two or more patterns may have a form extended to a voltage application part.

According to another exemplary embodiment, when an edge of the transparent substrate is a decoration part and a central portion surrounded by the decoration part is an effective screen part, the conductive film provided on the portion in which no concave portions or protrusion portions are present on the upper surface of the transparent substrate includes two or more patterns electrically disconnected from each other by the concave portions or the protrusion portions, and at least a part of the two or more patterns may include an effective screen region provided in the effective screen part and a router region provided in the decoration part and electrically connecting the effective screen region to a voltage application part.

Figure 3B:
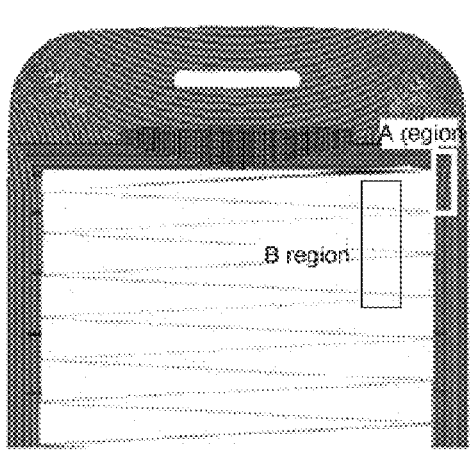
Figures 3C, 3E:
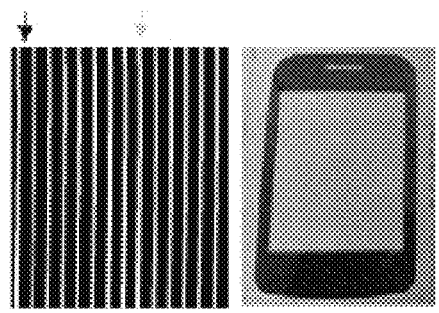
Figures 3D, 3F:
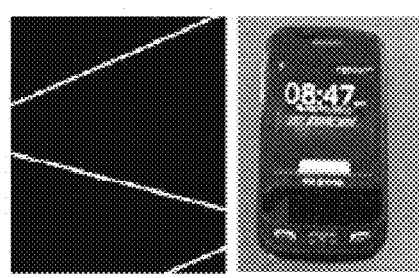

FIG. 3 illustrates a pattern form of a conductive film of the conductive pattern laminate according to an exemplary embodiment of the present application.

According to another exemplary embodiment of the present application, an additional conductive layer may be provided in a router region of the transparent conductive film provided in the decoration part. The surface resistance may be reduced by an additional conductive layer. The additional conductive layer may be formed of a material having an electric conductivity higher than that of the transparent conductive film. For example, the additional conductive layer may be a metal layer. Among metals, those having high conductivity may be favorably used.

In the aforementioned exemplary embodiments, as a material for the additional conductive layer, a single film or a multilayered film including gold, silver, aluminum, copper, neodymium, molybdenum, nickel, or an alloy thereof may be used, but the material is not limited thereto. Herein, the thickness of the additional conductive layer is not particularly limited, but may be 0.01 μm to 10 μm and 0.01 μm to 1 μm, and the range is preferred in terms of conductivity of the conductive film and economic efficiency of the forming process thereof.

FIG. 2 illustrates an example in which an additional conductive layer is formed on a decoration part.

In this case, in order to maintain the electric disconnection by concave portions or protrusion portions, the height of the concave portions or the protrusion portions may be controlled so as to be larger than the sum of the height of the transparent conductive film and the height of the additional conductive layer.

According to the exemplary embodiments, the transparent conductive film may be provided over the entire region of the upper surface of the transparent substrate.

A portion in which a portion in which the router regions are provided in the decoration part on the upper surface of the transparent substrate is excluded may have a structure in which the transparent conductive film provided in the portion in which no concave portions or protrusion portions are present is electrically disconnected from the voltage application part by concave portions or protrusion portions.

According to another exemplary embodiment of the present application, a decoration layer is provided over the entire region of the upper surface of a transparent conductive film provided in the decoration part.

In this case, in order to maintain the electric disconnection by concave portions or protrusion portions, the depth of the concave portions or the height of the protrusion portions may be controlled so as to be larger than the sum of the thickness of the transparent conductive film and the thickness of the decoration layer.

An additional conductive layer may be provided between the router region of the transparent conductive film and the decoration layer, or on the upper surface of the decoration layer. The role of the additional conductive layer is the same as described above.

In this case, in order to maintain the electric disconnection by the concave portions or the protrusion portions, the depth of the concave portions or the height of the protrusion portions may be controlled so as to be larger than the sum of the thickness of the transparent conductive film, the thickness of the additional conductive layer and the thickness of the decoration layer.

The additional conductive layer may be a metal layer. In this case, the decoration layer may be composed of a darkened layer of the metal layer.

An additional conductive layer may be provided in a router region as well as between the transparent conductive film provided in the entire decoration part and the decoration layer, or on the upper surface of the decoration layer. Only an effective screen part protects a protective layer and a conductive layer may be formed entirely on the rest part without any need for separately manufacturing the pattern of the additional conductive layer, which is favored for the process.

Likewise, in order to maintain the electric disconnection by the concave portions or the protrusion portions, the depth of the concave portions or the height of the protrusion portions may be controlled so as to be larger than the sum of the thickness of the transparent conductive film, the thickness of the additional conductive layer and the thickness of the decoration layer.

The additional conductive layer may be a metal layer. In this case, the decoration layer may be composed of a darkened layer of the metal layer.

According to an exemplary embodiment of the present application, a portion provided on the upper surface of the router region of the transparent conductive film in the decoration layer and on the upper surface of the transparent conductive film electrically disconnected from the voltage application part by concave portions or protrusion portions may include a fine pattern having a fine short-circuit width. A region including the fine pattern may additionally include a dummy pattern.

Another exemplary embodiment of the present application provides an electronic apparatus including at least one of the aforementioned conductive pattern laminates. According to an exemplary embodiment of the present application, the electronic apparatus may be a touch screen, an organic light emitting device, an organic light emitting device lighting and the like. The touch screen may also include only one of the aforementioned conductive pattern laminate, but may also include a form in which two or more of the aforementioned pattern laminates are laminated in the same direction or the opposite directions if necessary. In this case, an insulation layer or an optical adhesive layer may also be used if necessary. The electronic apparatus may be a decoration integral-type touch panel. Further, the metal layer provided on the router region may serve as an antenna by modifying the structure, the form and the like.

In addition, the organic light emitting device or the organic light emitting device lighting may include the aforementioned conductive pattern laminate as a transparent electrode.

Another exemplary embodiment of the present application provides a method for manufacturing the aforementioned conductive pattern laminate.

Specifically, the method includes: preparing a substrate including concave portions or protrusion portions; and forming a conductive film having a thickness less than a depth of the concave portions or a height of the protrusion portions over an entire region of an upper surface of the substrate, such as by ITO deposition.

The preparing of the substrate including the concave portions or the protrusion portions may be performed by forming a resin layer on a substrate and forming concave portions or protrusion portions on the resin layer using a soft mold and an imprinting method, which can include applying pressure to make the imprint followed by UV curing. As the soft mold, those known in the art may be used. In particular, it is possible to use a method for forming a high step difference pattern using a negative-type photoresist. Furthermore, a glass master mold may be prepared using a dry or wet etching process, and a soft mold may also be prepared using the master mold.

The resin layer may include a thermosetting resin or a UV-curable resin.

In order to form an additional conductive layer on the decoration part, the method may further include: protecting a portion in which an edge of the substrate on which the conductive film is formed is excluded with a protective film; and forming an additional conductive layer on the edge. Herein, the protective film may be a shadow mask, and a protective film or a photoresist may also be used. Subsequently, the method may further include forming a decoration layer on the additional conductive layer. Finally, the method may further include removing the protective film.

In the present application, the color, form, thickness and the like in the decoration layer are not particularly limited, as long as the decoration layer may impart the visual aesthetic sense. However, as described above, when a metal layer is formed as an additional conductive layer, the decoration layer may be formed as a darkened layer.

The darkened layer may be a layer in which a reflective diffraction strength of a reflective diffraction image obtained by irradiating light from a point light source onto one surface, on which the darkened layer is visualized, is reduced by 60% or more compared to a touch screen having an identical configuration except that the metal layer is composed of Al and does not include a darkened layer. Herein, the darkened layer may be a layer in which the reflective diffraction strength is reduced by 60% or more, 70% or more, and 80% or more compared to a touch screen having an identical configuration except that the metal layer is composed of Al and does not include a darkened layer. For example, the darkened layer may be a layer in which the reflective diffraction strength is reduced by 60% to 70%, 70% to 80%, and 80% to 85%.

In the present application, the darkened layer may be a layer in which the total reflectance measured using a total reflectance measuring device which assumes ambient light onto one surface, on which the darkened layer is visualized, is reduced by 20% or more compared to a touch screen having an identical configuration except that the metal layer is composed of Al and does not include a darkened layer. Herein, the darkened layer may be a layer in which the total reflectance is reduced by 20% or more, 25% or more and 30% or more compared to a touch screen having an identical configuration except that the metal layer is composed of Al and does not include a darkened layer. For example, the darkened layer may be a layer in which the total reflectance is reduced by 25% to 50%.

In the present application, the darkened layer may be provided over the entire surface on the metal layer, so that visibility may be reduced according to the high reflectance of the metal layer. In this case, since the darkened layer has destructive interference and self-light absorbance under a specific thickness condition when the darkened layer is bonded to a layer having high reflectance such as a metal layer, an effect of reducing the reflectance by the metal layer is exhibited by similarly adjusting quantities of light reflected by the darkened layer and light reflected by the metal layer through the darkened layer and simultaneously, guiding mutual destructive interference between two lights under the specific thickness condition.

In this case, in the color range of a pattern region composed of the darkened layer and the metal layer, which is measured from the surface from which the darkened layer according to the present application is visible, an L value may be 20 or less, an A value may be −10 to 10, and a B value may be −70 to 70, the L value may be 10 or less, the A value may be −5 to 5, and the B value may be 0 to 35, and the L value may be 5 or less, the A value may be −2 to 2, and the B value may be 0 to 15 based on a CIE LAB color coordinate.

Further, the total reflectance of the region composed of the darkened layer and the metal layer, which is measured from the surface from which the darkened layer according to the present application is visible, may be 17% or less, 10% or less, an 5% or less based on an external light of 550 nm.

Herein, the total reflectance means a reflectance in consideration of both diffuse reflectance and specular reflectance. The total reflectance is a value observed by setting the reflectance of an opposite surface of the surface to be measured in reflectance to 0 by using a black paste, a tape or the like and then measuring only the reflectance of the surface to be measured, and in this case, a diffuse light source that is most similar to the ambient light condition is introduced as a provided light source. In addition, in this case, the measurement position at which the reflectance is measured is based on a position that is inclined at about 7 degrees from a vertical line of a hemisphere of an integrating sphere.

The darkened layer is provided on the additional conductive layer while an attachment layer or an adhesive layer is not interposed therebetween. The attachment layer or the adhesive layer may affect durability or optical properties.

As the thickness of the darkened layer, any thickness may be used as long as the darkened layer has a destructive interference property and an absorption coefficient property which are the aforementioned physical properties and the thickness of the darkened layer satisfies the thickness condition of $\lambda/(4 \times n) = N$ (herein, N is an odd number) when the wavelength of light is defined as $\lambda$, and the refractive index of the darkened layer is defined as n. It is preferred that the thickness is selected from 10 nm to 400 nm, but the preferred thickness may be different according to the material used and the manufacturing process, and the scope of the present application is not limited by the numerical range.

The darkened layer may be composed of a single layer, or a plurality of layers of two or more layers.

It is preferred that the darkened layer have a color that is close to an achromatic color. However, the color need not be an achromatic color, and the darkened layer may be introduced as long as the reflectance is low even though the darkened layer has a color. In this case, the achromatic color means a color exhibited when light incident on a surface of a body is not selectively absorbed and evenly reflected and absorbed with respect to a wavelength of each component. In the present application, the darkened layer may use a material having a standard deviation of total reflectance for each wavelength of 50% or less when the total reflectance is measured in a visible ray region (400 nm to 800 nm).

The material of the darkened layer is a light absorbing material, and preferably may use any materials without a particular limitation as long as the material is composed of metal, metal oxide, metal nitride or metal oxynitride having the aforementioned physical properties when the entire surface layer is formed.

For example, the darkened layer may be an oxide film, a nitride film, an oxide-nitride film, a carbide film, a metal film or a combination thereof obtained by using Ni, Mo, Ti, Cr, and the like under a deposition condition and the like set by the person skilled in the art.

As a specific example thereof, the darkened layer may include both Ni and Mo. The darkened layer may include 50 to 98 atom % of Ni and 2 to 50 atom % of Mo, and may further include 0.01 to 10 atom % of other metals, for example, atoms such as Fe, Ta, and Ti. Herein, the darkened layer may further include 0.01 to 30 atom % of nitrogen or 4 atom % or less of oxygen and carbon, if necessary.

As another specific example thereof, the darkened layer may include a dielectric material selected from SiO, $SiO_2$, $MgF_2$ and $SiN_x$ (x is an integer of 1 or more) and a metal selected from Fe, Co, Ti, V, Al, Cu, Au and Ag, and may further include an alloy of two or more metals selected from Fe, Co, Ti, V, Al, Cu, Au and Ag. It is preferred that the dielectric material is distributed to be gradually decreased in an amount as the dielectric material moves farther from an incident direction of external light, and the metal and alloy component are distributed on the contrary. In this case, it is preferred that the content of the dielectric material is 20 to 50 wt % and the content of the metal is 50 to 80 wt %. When the darkened layer further includes the alloy, it is preferred that the darkened layer includes 10 to 30 wt % of the dielectric material, 50 to 80 wt % of the metal, and 5 to 40 wt % of the alloy.

As another specific example thereof, the darkened layer may be composed of a thin film including an alloy of nickel and vanadium, and one or more of oxide, nitride, and oxynitride of nickel and vanadium. In this case, it is preferred that vanadium is contained in an amount of 26 to 52 atom %, and it is preferred that an atomic ratio of vanadium to nickel is 26/74 to 52/48.

As another specific example thereof, the darkened layer may include a transition layer in which two or more elements are comprised and a composition ratio of one element is increased by about a maximum of 20% per 100 angstrom according to an incident direction of external light. In this case, one element may be a metal element such as chromium, tungsten, tantalum, titanium, iron, nickel or molybdenum, and an element other than the metal element may be oxygen, nitrogen or carbon.

As another specific example thereof, the darkened layer may include a first chromium oxide layer, a metal layer, a second chromium oxide layer and a chromium mirror, and in this case, may include metal selected from tungsten, vanadium, iron, chromium, molybdenum and niobium instead of chromium. The metal layer may have a thickness of 10 to 30 nm, the first chromium oxide layer may have a thickness of 35 to 41 nm, and the second chromium oxide layer may have a thickness of 37 to 42 nm.

As another specific example thereof, a laminate structure of an alumina ($Al_2O_3$) layer, a chromium oxide ($Cr_2O_3$) layer and a chromium (Cr) layer may be used as the darkened layer. Herein, the alumina layer has properties of improving a reflection property and preventing light diffusion, and the chromium oxide layer may enhance a contrast property by decreasing the specular reflectance.

In the present application, the darkened layer may be provided at the surface side on which the conductive pattern laminate is visually recognized. In other words, the darkened layer may be provided on the upper surface of the metal layer, and may also be provided between the conductive film and the metal layer in the conductive pattern laminate.

In the present application, the conductive pattern laminate may or may not additionally include an undercoating layer between a substrate and a conductive pattern.

In a general conductive pattern laminate in the related art, a transparent under coating layer is formed on a substrate by a wet coating or vacuum sputtering method, and then a transparent conductive layer such as ITO is formed by a sputtering system. Meanwhile, as the use of a capacitive touch panel has been recently increased, it is required to implement a low resistance and improve the visibility of the conductive pattern.

In order to implement the low resistance, the thickness of the conductive pattern needs to be increased, but as the thickness of the conductive pattern is increased, there is a disadvantage in that transmittance deteriorates. Further, when the thickness of the conductive pattern is increased, the problem of visibility due to the difference in refractive index between the conductive pattern and the under coating layer is further aggravated. After all, the ITO layer tends to be thickened to a predetermined thickness in order to lower the resistance value, and an index matching is performed in order to minimize the difference in refractive index between the layers. Various under coating layers having different refractive indices may be formed between the conductive pattern and the substrate such that the difference in refractive index is offset for the index matching.

That is, the conductive pattern laminate according to the present application may include an additional under coating layer so as to be suitable for the use, characteristics and the like thereof.

The under coating layer may include one or more of a high refractive index under coating layer and a low refractive index under coating layer. The high refractive index under coating layer and the low refractive index under coating layer may be each independently formed by various materials such as an inorganic material, an organic material, a mixture of the inorganic material and the organic material and the like. As the inorganic material, $SiO_2$, $MgF_2$, $Al_2O_3$, NaF, $Na_3AlF_6$, LiF, $CaF_2$, $BaF_2$, $LaF_3$, $CeF_3$ and the like may be used. As the organic material, a melamine resin, an alkyd resin, a urethane resin, an acrylic resin, a siloxane-based polymer, an organic silane condensate and the like may be used.

As the high refractive index under coating layer, a resin which may be crosslinked by a method such as thermal curing or UV curing after the coating may also be used. As the low refractive index under coating layer, a fluorine resin that may cause a crosslinking reaction, a thermosetting silica sol, a silica coating film by sputtering and the like may be used.

The high refractive index under coating layer may be coated within a thickness range of 1 to 21 μm. The high refractive index under coating layer may have a refractive index of 1.55 to 1.70.

The low refractive index under coating layer may be formed to have a refractive index of 1.30 to 1.46 and a thickness of 0.01 to 0.05 μm.

According to an exemplary embodiment of the present application, the conductive film may be an opaque conductive film.

Another exemplary embodiment of the present application provides an electronic apparatus including at least one of the conductive pattern laminates including the aforementioned opaque conductive film. The electronic apparatus includes an organic thin film transistor, an organic light emitting device, an organic solar cell, an organic laser, an electromagnetic wave-shielding film, a capacitor, a memory device and the like.

Another exemplary embodiment of the present application provides a method for manufacturing a conductive pattern laminate, the method including: preparing a substrate including concave portions or protrusion portions; and forming a conductive film having a thickness less than a depth of the concave portions or a height of the protrusion portions over an entire region of an upper surface of the substrate. In the method for manufacturing a conductive pattern laminate, since the description on the concave portions, the protrusion portions, the substrate, the conductive film and the like is the same as that described above, the specific description on that will be omitted.

The method for manufacturing a conductive pattern laminate may further include: protecting a portion in which an edge of the substrate on which the conductive film is formed is excluded with a protective film; and forming an additional conductive layer on the edge.

The method for manufacturing a conductive pattern laminate may further include forming a decoration layer on the additional conductive layer.

The method for manufacturing a conductive pattern laminate may further include removing the protective film.

A schematic view of a process of manufacturing the conductive pattern laminate according to an exemplary embodiment of the present application is illustrated in the following FIG. 4.

Hereinafter, preferred Examples will be presented for better understanding of the present application. However, the following Examples are provided for illustrating the present application, and the scope of the present application is not limited by the Examples.

EXAMPLES

Example 1

A novolac resin-based photoresist was spin-coated at a thickness of about 10 μm onto a glass substrate, and then exposed by using an i-line stepper, thereby forming a pattern including concave portions or protrusion portions. The forms of the pattern including the concave portions or the protrusion portions are illustrated in the following FIGS. 5 to 9. As in the following FIGS. 5 to 9, since the taper angle of the pattern including the concave portions or the protrusion portions is about 90 degrees, disconnection of the conductive film may be formed by the pattern including the concave portions or the protrusion portions when a conductive material is deposited on the pattern including the concave portions or the protrusion portions.

Example 2

A SU-8 photoresist was spin-coated at a thickness of about 6.5 μm onto a glass substrate, and then a pattern including concave portions or protrusion portions was formed through laser exposure. As a result, as in the following FIG. 10, a taper angle is present on the glass surface and on the air surface, but it can be seen that there is an interval in which the taper angle is vertical to the pattern intermediate of the concave portions or the protrusion portions.

Accordingly, when a conductive material is deposited on the pattern including the concave portions or the protrusion portions, disconnection of the conductive film may be formed by the pattern including the concave portions or the protrusion portions.

Comparative Example 1

A primary replica soft mold and a secondary replica soft mold which replicates the primary mold were manufactured by using glass master molds subjected to wet etching (etching depth 1 to 3 μm), and metal was deposited, and as a result, the metal layer was connected without producing disconnection of the metal layer, which was expected from a circular taper angle of a pattern stepped portion caused by the isotropic wet etching of glass. The results are illustrated in FIG. 11.

The invention claimed is:

1. A conductive pattern laminate, comprising:
    a substrate having concave portions and protrusion portions on an upper surface thereof; and
    a conductive film provided on an upper surface of the concave portions and the protrusion portions of the substrate,
    wherein the conductive film provided on the upper surface of the concave portions of the substrate and the conductive film provided on the upper surface of the protrusion portions of the substrate are electrically disconnected from each other; and
    wherein an edge of the substrate is a decoration part and a central portion surrounded by the decoration part is an effective screen part; and
    wherein the conductive film comprises two or more patterns electrically disconnected from each other by the concave portions and the protrusion portions, and at least a part of the two or more patterns comprise an effective screen region provided in the effective screen part and a router region provided in the decoration part and electrically connecting the effective screen region to a voltage application part; and
    wherein a metal layer is provided on the router region of the conductive film provided in the decoration part.

2. The conductive pattern laminate of claim 1, wherein a depth of the concave portions or a height of the protrusion portions is larger than a thickness of the conductive film.

3. The conductive pattern laminate of claim 1, wherein a depth of the concave portions or a height of the protrusion portions is 0.1 to 30 μm.

4. The conductive pattern laminate of claim 1, wherein a taper angle of at least a part of the concave portions or the protrusion portions is 60 or more degrees.

5. The conductive pattern laminate of claim 1, wherein the concave portions comprise two or more concave portions which are different in depth, and
the protrusion portions comprise two or more protrusion portions which are different in height.

6. The conductive pattern laminate of claim 1, wherein the concave portions and the protrusion portions are provided in a form that the conductive film is separated into two or more patterns which are electrically disconnected from each other.

7. The conductive pattern laminate of claim 1, wherein the conductive film comprises two or more patterns electrically disconnected from each other by the concave portions and the protrusion portions, and
at least a part of the two or more patterns have a form extended to a voltage application part.

8. The conductive pattern laminate of claim 1, wherein a depth of the concave portions or a height of the protrusion portions is larger than a sum of a height of the conductive film and a height of the additional conductive layer.

9. The conductive pattern laminate of claim 1, wherein the conductive film is provided over an entire region of the upper surface of the substrate.

10. The conductive pattern laminate of claim 1, wherein the substrate is a resin substrate.

11. The conductive pattern laminate of claim 10, wherein the resin substrate is a UV-curable resin substrate.

12. The conductive pattern laminate of claim 1, wherein in a portion in which the router regions are excluded in the decoration part on the upper surface of the substrate, the conductive film is electrically disconnected from the voltage application part by the concave portions and the protrusion portions.

13. The conductive pattern laminate of claim 12, wherein a decoration layer is provided over the entire region of the upper surface of the conductive film provided in the decoration part.

14. The conductive pattern laminate of claim 13, wherein a depth of the concave portions or a height of the protrusion portions is larger than a sum of a thickness of the conductive film and a thickness of the decoration layer.

15. The conductive pattern laminate of claim 13, wherein a depth of the concave portions or a height of the protrusion portions is larger than a sum of a thickness of the conductive film, a thickness of the metal layer and a thickness of the decoration layer.

16. The conductive pattern laminate of claim 13, wherein the decoration layer is a darkened layer of the metal layer.

17. An electronic apparatus comprising one or more of the conductive pattern laminate of claim 1.

18. A touch screen comprising one or more of the conductive pattern laminate of claim 1.

19. A method for manufacturing a conductive pattern laminate, the method comprising:
preparing a substrate comprising concave portions and protrusion portions;
forming a conductive film having a thickness less than a depth of the concave portions or a height of the protrusion portions over an entire region of an upper surface of the substrate;
protecting a portion in which an edge of the substrate on which the conductive film is formed is excluded with a protective film; and
forming a metal layer on the edge.

20. The method of claim 19, further comprising:
forming a decoration layer on the metal layer.

21. The method of claim 19, further comprising:
removing the protective film.

* * * * *